(12) United States Patent
Zanchi (10) Patent No.: US 9,929,739 B1
(45) Date of Patent: Mar. 27, 2018

(54) METHODS AND SYSTEMS FOR DETERMINING INTEGRAL NON-LINEARITY

(71) Applicant: THE BOEING COMPANY, Chicago, IL (US)

(72) Inventor: Alfio Zanchi, Huntington Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/613,625

(22) Filed: Jun. 5, 2017

(51) Int. Cl.
| | | |
|---|---|---|
| *H03M 1/10* | (2006.01) | |
| *H03M 1/06* | (2006.01) | |
| *H03M 1/12* | (2006.01) | |
| *H03M 1/08* | (2006.01) | |

(52) U.S. Cl.
CPC ....... *H03M 1/1033* (2013.01); *H03M 1/0612* (2013.01); *H03M 1/0663* (2013.01); *H03M 1/0863* (2013.01); *H03M 1/1019* (2013.01); *H03M 1/1235* (2013.01)

(58) Field of Classification Search
CPC ............. H03M 1/1033; H03M 1/0612; H03M 1/0663; H03M 1/0863; H03M 1/1019; H03M 1/1235
USPC .......................................... 341/120, 118, 155
See application file for complete search history.

(56) References Cited

U.S. PATENT DOCUMENTS

| | | | | |
|---|---|---|---|---|
| 6,177,894 B1* | 1/2001 | Yamaguchi | ......... | H03M 1/1085 341/120 |
| 6,211,803 B1* | 4/2001 | Sunter | .................. | H03M 1/109 341/118 |
| 6,580,380 B2* | 6/2003 | Oh | ........................ | H03M 1/109 341/120 |
| 6,640,193 B2 | 10/2003 | Kuyel | | |
| 7,411,532 B2 | 8/2008 | Zanchi et al. | | |
| 7,439,888 B2 | 10/2008 | Zanchi et al. | | |

OTHER PUBLICATIONS

Zanchi, A. et al., "Measurement and Spice Prediction of Sub-picosecond Clock Jitter in A/D Converters" in IEEE International Symposium Circuits and Systems (ISCAS), vol. 5, May 2003, pp. 557-560.
LTC2217 16-Bit, 105 Msps Low Noise ADC, Linear Technology, 2007, 32 pages.
PDL-100A Programmable Delay Line Operating and Programming Manual, Colby Instruments, 2010, 72 pages.
R&S® SMA100A Signal Generator Specifications Datasheet 07.00, Rohde & Schwarz, Oct. 2013, 36 pages.

(Continued)

*Primary Examiner* — Khai M Nguyen
(74) *Attorney, Agent, or Firm* — Armstrong Teasdale LLP (57) ABSTRACT

A method of determining Integral Non-Linearity (INL) of an Analog-to-Digital Converter (ADC) is provided. The method includes providing an input signal to the ADC, phase-locking a clock signal of a clock of the ADC to the input signal, generating a plurality of samples at a sampled phase on the input signal for a plurality of sampled phases, applying averaging to the plurality of samples for each sampled phase to generate a reconstructed ADC output signal, and determining the INL of the ADC based on a comparison of the reconstructed ADC output signal to a theoretical ADC output signal.

20 Claims, 5 Drawing Sheets

(56) References Cited

OTHER PUBLICATIONS

Zanchi, A. et al., Analysis and Characterization of the Effects of Clock Jitter in A/D Converters for Subsampling, IEEE Transactions on Circuits and Systems-I: Regular Papers, vol. 55, No. 2, Mar. 2008, pp. 522-534.
Doernberg, J. et al., Full-Speed Testing of A/D Converters, IEEE Journal of Solid-State Circuits, Vo. SC-19, No. 6, Deember 1984, pp. 820-827.

* cited by examiner

METHODS AND SYSTEMS FOR DETERMINING INTEGRAL NON-LINEARITY

STATEMENT REGARDING FEDERALLY SPONSORED RESEARCH & DEVELOPMENT

This invention was made with United States Government support. The government has certain rights in the invention.

BACKGROUND

The field of the disclosure relates generally to signal processing apparatuses embedding Analog-to-Digital Converters (ADCs) and, more particularly, to methods and systems for determining the Integral Non-Linearity (INL) and consequently the Differential Non-Linearity (DNL) of ADCs.

At least some known signal processing systems trade ADC resolution for speed (or, sampling data rate). This practice however results in an ADC with coarsely quantized transfer functions, whose readings may not be easily calibrated. Prior art solutions for calibrating the ADC rely on methods of extracting the non-linearity to be corrected for, which are based either on: an input signal ramp, which cannot be used for band-pass ADCs; or sinusoidal input signals, whose diverging probability distribution numerically requires disposing of the quantized levels close to the bottom and top of the conversion range (i.e. 25% of all data, if top and bottom levels are discarded for an 8-level 3-bit readings).

More specifically, traditional linearity tests on ADCs are conducted according to a "histogram method", where a population of digital output codes collected from an ADC stimulated in a known pattern is binned into a histogram with a minimum bin having a width of exactly 1 Least Significant Bit (LSB), and compared to an expected code distribution. The industry standard is a uniform pattern of stimulus to the ADC, i.e., a slow ramp that uniformly exercises every output code of the ADC. In this case, the distribution of the histogram at the ADC output is also supposed to be uniform; therefore, any deviations from uniformity of such histogram are ascribed to the inherent non-linearity of the ADC and characterized as DNL, because each deviation measures an error in the absolute size of each single code, as compared to the theoretical 1-LSB. A running integral of the DNL then yields the INL, which is customarily used in the art to characterize the total distortion introduced by the conversion process.

As stated, using a sequence of DC values, or one or multiple ramps (to speed-up automated testing), is the industry standard and simplifies the static linearity estimation process at large. However, many ADC cores have an inherently band-pass transfer function: due to, for example, an RF front-end preconditioning/amplification that requires AC coupling to remove DC offsets, quasi-DC slow drifts, and/or undesirable slow 1/f noise components. This characteristic may prevent the use of the classic DNL/INL testing method.

Moreover, the histogram method construes a histogram containing as many bins as many codes the ADC has. For a 16-bit ADC, e.g., the large population of $2^{16}$=65,536 bins may constitute an excellent statistical snapshot of the ADC. However, modern global positioning systems (GPS), some communication protocols, and most Radio Detection and Ranging/Light Detection and Ranging (RADAR/LIDAR) systems for aerospace and automotive applications use data-combining techniques from multiple antennas—for example, routed and converted at low-resolution into multiple channels—to maximize the throughput of the whole system. This approach relies on the fast conversion time of simple Flash ADCs with only 3-4 bits each, and often even less. The final outcome of the DNL/INL assessment process as applied to a 3-bit ADC is thus a scant 8-point piece-wise linear plot that is exceedingly difficult to interpret for any localized converter-induced distortion effect.

BRIEF DESCRIPTION

In one aspect, a method of determining the Integral Non-Linearity (INL) of an Analog-to-Digital Converter (ADC) is provided. The method includes providing an input signal to the ADC, phase-locking a clock signal of a clock of the ADC to the input signal, generating a plurality of samples at a sampled phase on the input signal for a plurality of sampled phases, applying averaging across the plurality of samples generated for each sampled phase of the input signal to generate a reconstructed ADC output signal, and determining the INL of the ADC based on a comparison of such ADC output signal to a theoretical ADC output signal.

In another aspect, a system for determining INL of an ADC is provided. The system includes a signal generator configured to provide an input signal to the ADC, and a processor. The processor is configured to phase-lock a clock signal of a clock of the ADC to the input signal, generate a plurality of samples at a sampled phase on the input signal for a plurality of sampled phases, apply averaging across the plurality of samples generated for each sampled phase of the input signal to generate a reconstructed ADC output signal, and determine the INL of the ADC based on a comparison of such ADC output signal to a theoretical ADC output signal.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIGS. 1-7 show example implementations of the apparatus and method described herein.

Although specific aspects or features of various implementations may be shown in some drawings and not in others, this is for convenience only. Any feature of any drawing may be referenced and/or claimed in combination with any other compatible feature of any other drawing or described in an implementation.

Unless otherwise indicated, the drawings provided herein are meant to illustrate features of implementations of the disclosure. These features are believed to be applicable in a wide variety of systems comprising one or more implementations of the disclosure. As such, the drawings are not meant to include all conventional features known by those of ordinary skill in the art to be required for the practice of the implementations disclosed herein.

DETAILED DESCRIPTION

Implementations of the methods and systems for determining Integral Non-Linearity (INL) described herein effectively improve the precision and intelligibility of INL extraction from Analog-to-Digital Converters (ADCs). Also, the methods and systems for determining INL described herein may be used for the calibration of data converters to improve speed, resolution, and reliability of ADCs without greatly increased circuit complexity and expense. Moreover, the methods and systems for determining INL described herein are implementable in modern applications demanding sampling frequencies into GigaHertz (GHz) ranges with 4-bit or lower resolution, to yield higher resolution and lower distortion performance as compared to uncalibrated systems.

Figure 1:
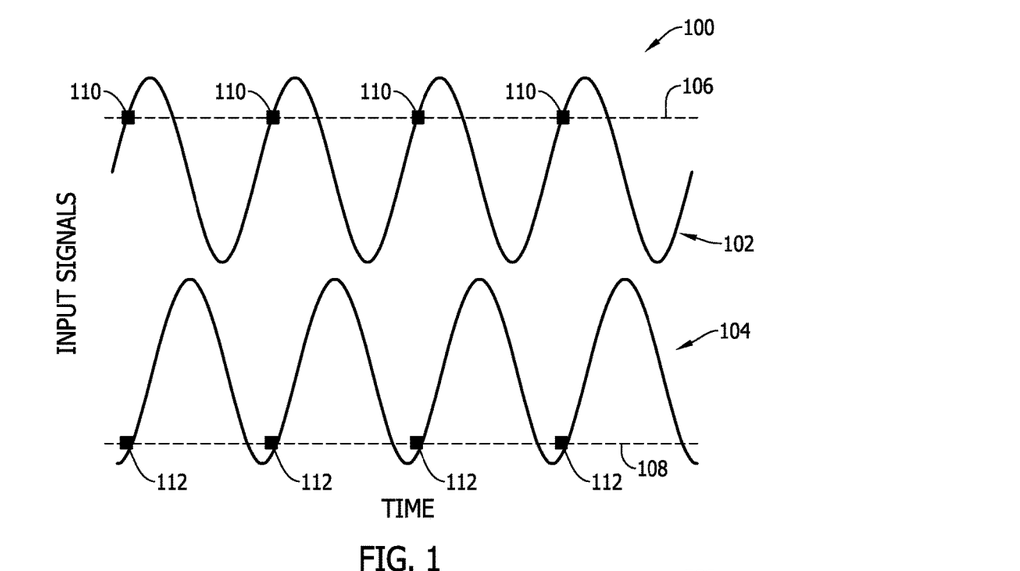
FIG. 1 is a graphical representation of two example input signals as sampled by a clock signal of an ADC.

FIG. 1 is a graphical representation 100 of input signals 102 and 104 relative to time, and of two identical sets of sampling instants 110 and 112 synchronous to a clock signal of the ADC relative to time. In the exemplary implementation, phase-locked (i.e., whose relative phase is constant over time) signals are provided to a clock input of a clock of the ADC and a signal input of the ADC. The input signal is received from a signal generator, for example, a radio frequency (RF) source, and includes a sine wave having a fixed frequency and fixed amplitude.

In the exemplary implementation, a clock signal of the clock is phase-locked, or aligned, to the input signal. More specifically, the clock signal is phase-locked to have the same (or a multiple, or submultiple, of) the frequency of the input signal 102 or 104. This dictates when each sample is taken out of the input signal 102 or 104 being fed at the ADC input. In one implementation, phase-locking the clock signal to the input signal includes generating a plurality of digital bit streams corresponding to constant "direct current" (DC) levels, which also include noise.

In FIG. 1, phase-locking the frequencies of the input signals 102 and 104 to the clock signal results in there always being one sampling instant (synchronous to the clock edge) within each period of the inputs, so there is one point per period in each diagram. Rather than by approximating a linear ramp as done by known systems then, testing a series of DC levels is reproduced by phase-locking the system clock signal and the input signal 102 and 104 of the ADC. The phase-locking forces the ADC to always sample the same point on the analog input signal, yielding constant point streams 106 and 108—yet located at different DC levels, according to the relative phase relationship between input signals 102 and 104 (which is, e.g., more delayed in phase) and the sampling clock. For example, even a band-pass ADC with an RF bandwidth from 2 to 18 GHz operated at 16 Giga-Samples per second (GSps) outputs a DC bit stream when the input is locked to the clock at exactly 16 GHz: that is, an equivalent static or slow signal can be obtained by feeding an appropriately fast input signal, fast enough to fit in the pass band of the ADC transfer function. Alternatively, when the frequency of the system clock signal is a multiple of the frequency of the input signal 102 or 104 (oversampling paradigm), a suitable sub-multiple of all the ADC output samples may be down-selected to observe only those points that were periodically decimated in correspondence of identical voltage levels on the input. Vice versa, when the frequency of the system clock signal that generates instants, which are synchronous to the sampling instants 110 and 112, is lower than the frequency of the input signal 102 or 104 (undersampling paradigm), corresponding points may simply be captured every 2, 3, . . . N periods rather than evenly at each period, returning however the same result.

Once the input signal 102 is phase-locked to the clock signal, a plurality of samples can be generated at a sampled phase on the input signal 102, in correspondence of the sampling instants 110. Because the input signal 102 and the clock signal are at the same frequency, the ADC samples at the same phase of the input signal 102. Different sampled phase points of the input signal 102 may be sampled by phase shifting the input signal with regards to the clock, for a plurality of sampled phases, such that different points on the input signal are sampled at each sample phase. Input signal 104 illustrates, for example, how additional phase delay added to the input, while the system clock is unchanged, yields a different (lower, in FIG. 1) DC sampled stream of points. In practice, both the input signal 102 and the system clock signal can be shifted relative to the other, achieving the same final result. It should be appreciated that a variety of other techniques can be employed for phase shifting one of the signal input and clock input relative to the other, so that different phases of the signal input can be captured.

By varying the relative phase of the input signal 102 versus the system clock signal, i.e., shifting one waveform versus the other, the relative level of the sampled points may be modified up and down the range (see e.g. 104). If the input signal 102 is sufficiently large, the whole span of the ADC range may be exercised, and even be made to saturate if so desired. The granularity of the DC shifts sampled onto the input sinusoid (the typical signal shape to test band-pass systems, in force of Fourier's Theorem) is theoretically only limited by the granularity of the phase shift across the two signal sources, which may be as low as 0.1-degree even on commercial apparatuses without further need for precision delay lines. A delay line affords great time precision and granularity, but presents a number of signal integrity drawbacks (such as glitches and variable attenuation) that may introduce visible artifacts in the context of linearity evaluation with enhanced accuracy as presented in this disclosure. To conclude, a representation of the phase-coherent principle is provided in FIG. 1, where two different constant point streams 106 and 108 of DC levels are obtained sampling at the instants denoted by squares on the input signals 102 and 104, producing the sequences of sampling instants 110 and 112, respectively.

Figure 2:
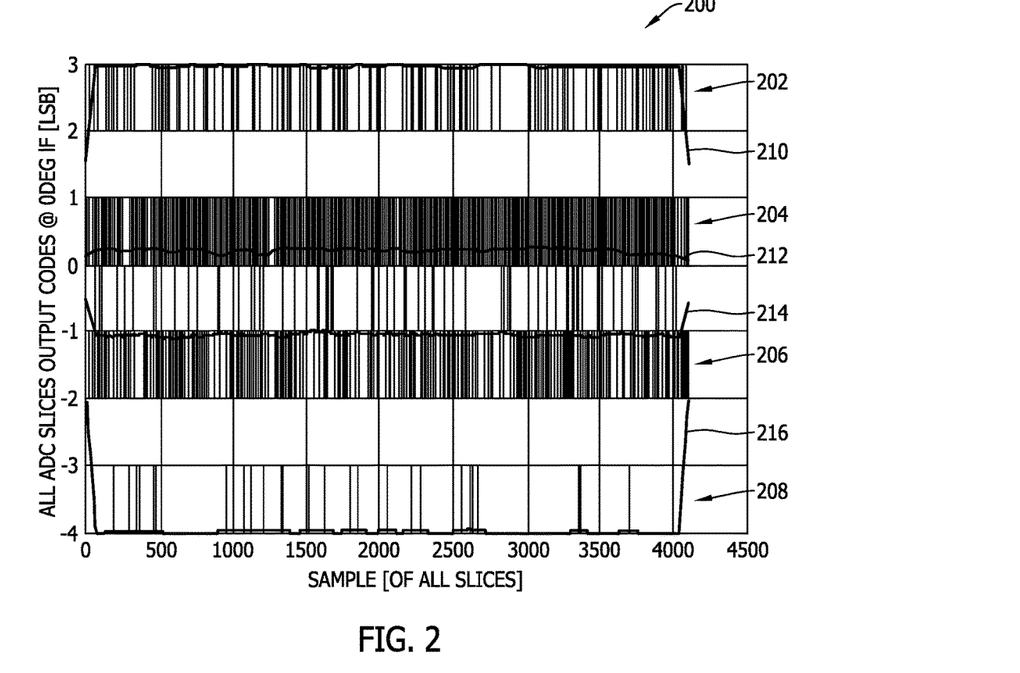
FIG. 2 is a graphical representation of an example of ADC output digital bit streams obtained from sampling four different phases of the ADC input versus the system clock, as shown in FIG. 1.

FIG. 2 is a graphical representation 200 of an example of how a 3-bit ADC treats four different phases of the ADC input versus the clock, resulting in generation of a plurality of samples having different levels of signal to be sampled at the ADC input, and converted at the ADC output. The plurality of samples includes a first sample 202, a second sample 204, a third sample 206, and a fourth sample 208.

In the case of a low-resolution ADC, meaningfully characterizing the noise affecting the DC streams is close to impossible: because not only is the thermal noise usually higher by design (high speeds require high bandwidths, which cause high RMS noise due to wideband fast noise components not being filtered), but correlated quantization noise caused by the output toggling across two coarse levels practically alters the noise statistics of the output beyond repair. However, even in low-resolution ADCs, the quantity that retains its meaning is the average of the DC stream. In fact, if the noise is high enough to guarantee proportional toggling of the ADC output across at least 2 LSB levels (let alone the 11-12 noisy levels of a 16-bit converter with e.g. 13-bit ENOB), the averages of the ADC output digital streams representing DC levels plus quantization noise vary linearly across the ADC threshold levels.

The bi-modal toggling of the noise at each of first sample 202, second sample 204, third sample 206, and fourth sample 208 has been transformed into a respective first moving average 210, second moving average 212, third moving average 214, and fourth moving average 216 in the graphical representation 200, with the averages superimposed to the native ADC digital output stream. The length of the record considered must be weighed against the kind of considerations which initially suggested the use of a band-pass system. For example, non-stationary flicker noise effects will still be present in the system, since they are congenital to the semiconductor implementation of the ADC: but could be largely eliminated by piece-wise Hadamard averaging, as compared to single-window averaging. Normally though, "boxcar" averages will still abate stationary noise such as non-modulated thermal terms: hence, the longer the averaged record, the more accurate the estimate of the DC level. Once an acceptable record length has been established for the specific ADC under test, then a corresponding series of single filtered values (averages over the chosen fixed-window length) is obtained from a series of phase sweeps across 360 degrees of angular phase of the input periodic signal. The filtered values should reconstruct the exact profile of the input sinusoid: that is, if the ADC transfer function were ideal.

Figure 3:
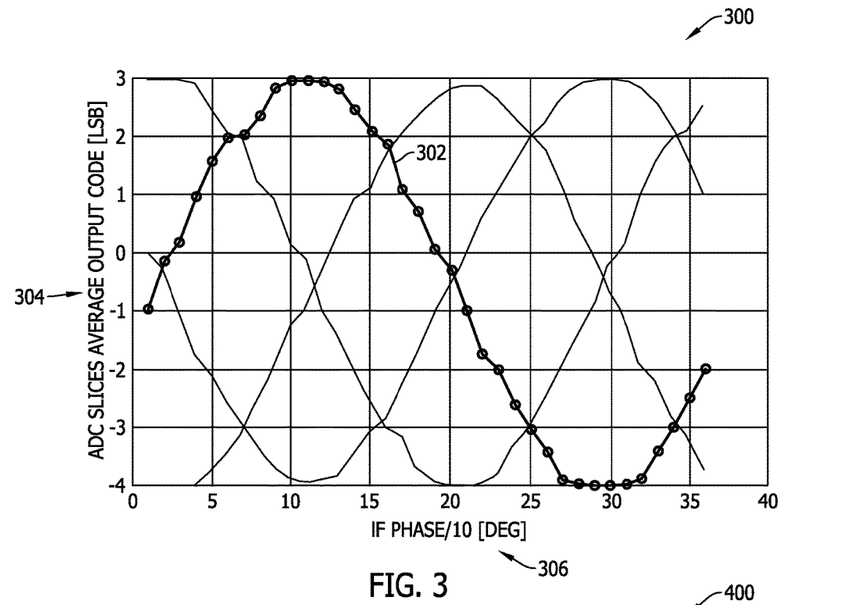
FIG. 3 is a graphical representation of the static reconstruction of the ADC output signal, spanning the whole conversion range.

FIG. 3 is a graphical representation 300 of an equivalent reconstructed ADC output signal 302 collected at different phases. More specifically, FIG. 3 sorts the sequence of average ADC outputs 304 plotted versus the linear input phase steps 306, according to the procedure as described in FIG. 2.

In the exemplary implementation, averaging is applied to the plurality of generated samples such as, for example, the reconstructed ADC output signal 302, to reconstruct each value (represented by a dot in graphical representation 300) of the reconstructed ADC output signal 302. In some embodiments the averaging includes averaging each of the plurality of digital bit streams to extract accurate DC values that reconstruct an equivalent time-sampled sinusoid period, when plotted against phase, as depicted in graphical representation 300.

The reconstruction shown in FIG. 3 is relatively coarse because the phase step is as large as 10 degrees. The collection of the averages of all the records of the type shown in FIG. 2 amounts to 36 records, which correspond to 360 degrees divided by 10 degrees per step. This univocal correspondence generates the reconstructed output sinusoid with, in this case, 36 points, as shown in FIG. 3. In conclusion, FIG. 3 illustrates the method as used with 36 steps of 10 degrees each, but the same procedure may be refined down to 0.1 degrees, or 3,600 steps, turning into as many useful points for INL post-processing.

Additionally, FIG. 3 shows four ADCs "slices" that are to be used in time-interleaved fashion, and are therefore appropriately time-skewed by 90 degrees.

Figure 4:
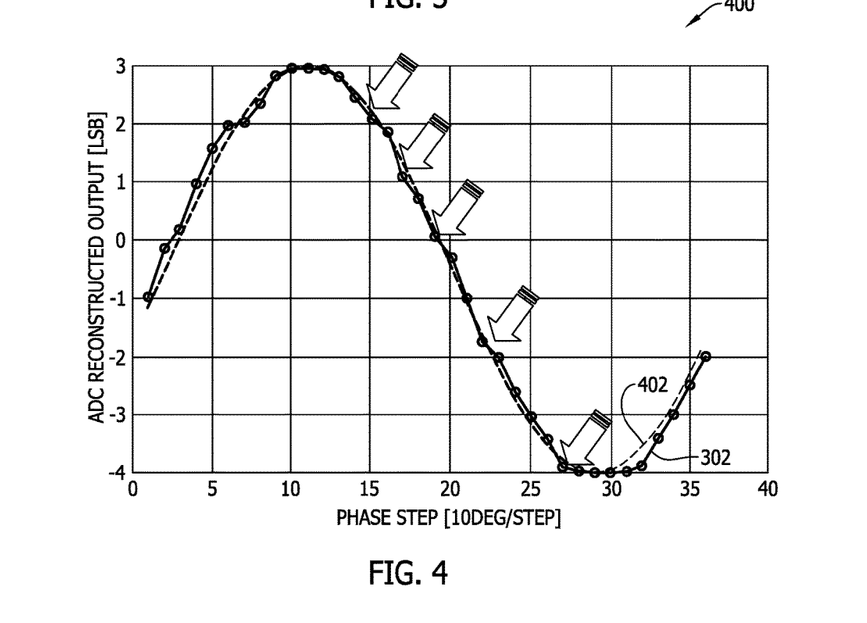
FIG. 4 is a graphical representation of the ADC output signal shown in FIG. 3 relative to an ideal static reconstruction of the ADC output signal as provided by a theoretical ADC.

FIG. 4 is a graphical representation 400 of the reconstructed ADC output signal 302 (shown in FIG. 3) relative to a theoretical ADC output signal 402 that would be returned by a theoretically ideal ADC. By way of example, the data relative to the ADC slice highlighted with dots 302 has been best-fitted in its central part—i.e., before saturation effects at the edges of the reconstructed ADC output signal 302 dramatically change the fitting characteristics. In FIG. 4, the reconstructed ADC output signal 302 is represented by a solid curve with dots, and the theoretical ADC output signal 402 is represented by a dashed curve. Comparing the measured reconstructed ADC output signal 302 to the theoretical ADC output signal 402 reveals numerous discrepancies (shown by the arrows). These discrepancies define the integral non-linearity (INL) of the ADC, which is the discrepancy between the signal that should be coming out of the ADC if it were ideal, versus the signal that is actually coming out of the ADC.

Figure 5:
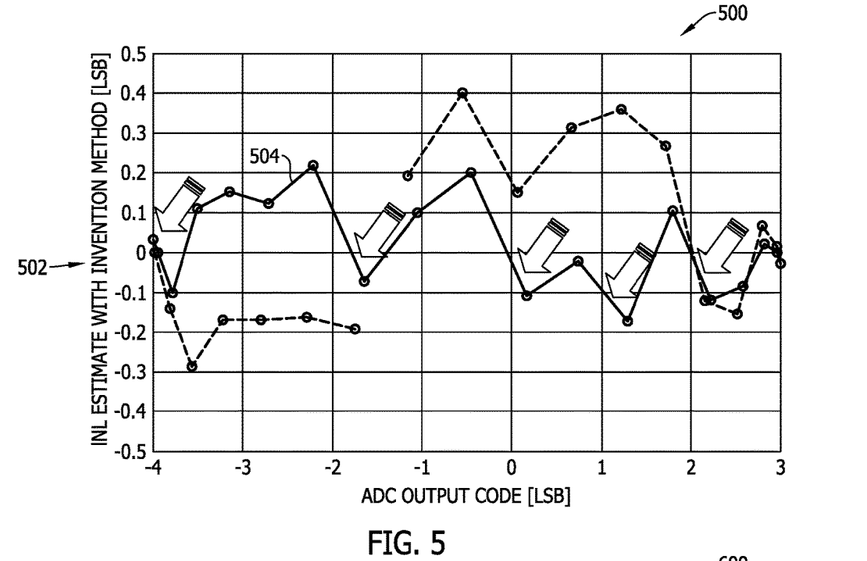
FIG. 5 is a graphical representation of an INL profile determined for the ADC according to the teachings of this invention.

FIG. 5 is a graphical representation 500 of an INL profile 502 for the ADC. Specifically, the deformations in the reconstructed ADC output signal 302 shown in FIGS. 3 and 4 are the outcome of a non-ideal linearity. In this representative implementation, the INL profile 502 is determined based on the comparison of the theoretical ADC output signal 402 against the reconstructed ADC output signal 302. Mathematically, a period of the theoretical ADC output signal 402 is subtracted from a period of the reconstructed ADC output signal 302 (or half-period—half a sinusoid may be already sufficient to span the whole ADC range when measured with the right phase, according to Nyquist's Theorem) to generate a residual error plot 504. The plot corresponds to the INL profile 502 over 36 points—subsequently reduced to 18, to account only for the center part of the plot. The relevant part of the residual error plot 504 is represented by the thicker solid line. All of the localized INL discrepancies, or gaps, indicated by the arrows in FIG. 4 are identified verbatim by INL troughs (shown by arrows in FIG. 5), which point to some of the Flash ADC thresholds being offset with respect to their ideal locations. Some cubic bowing may be identified which would prompt the designer, or the investigator at large, to verify its nature via additional experiments, and especially a finer sequence of phase shifts. Finally, the Differential Non-Linearity (DNL) would merely be obtained by differentiation, contrary to what is customarily done in the histogram method. The positive and negative slope sides of the sinusoid may be separately evaluated by scanning all 360 degrees of the input period; and they can be merged together to cancel out any hysteresis effect.

Figure 6:
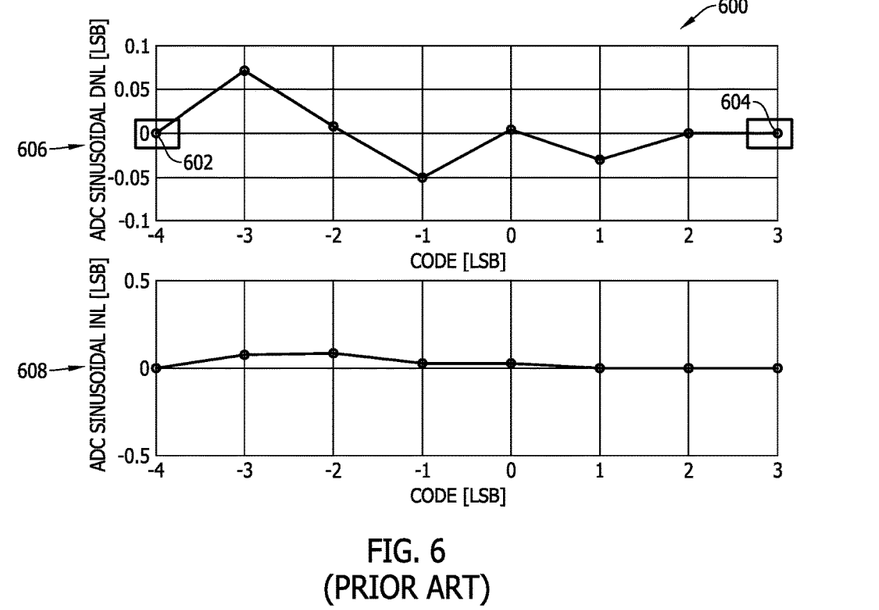
FIG. 6 is a graphical representation of an INL profile determined for the same ADC using known techniques.

FIG. 6 is a graphical representation 600 of a DNL and INL profile extracted from an ADC using prior-art techniques. If the known histogram method was applied in its sinusoidal distribution form to a 16K-point data record capture, at a frequency very close to the coherent RF frequency used to obtain FIGS. 4 and 5, the known INL extraction process would return an INL graph 608, as shown in FIG. 6. Yet because the sinusoidal probability density function abruptly diverges at the edges, the prior art histogram method loses at least the two extreme points 602, 604, as they are forcibly zeroed out in the DNL graph 606 of FIG. 6 due to numerical divergence phenomena. This would not even be noticeable on a 16-bit ADC's 65,536 bin histogram (where it represents a 0.003% data loss); however, it is unacceptable on a 3-bit ADC's 8-bin histogram, as losing 2 points out of 8 points is a 25% data loss. This circumstance further degrades the worth of the INL graph 608 of FIG. 6; not to mention the residual numerical problems related to approximating a divergent probability density function curve with a raw 6-segment piece-wise linear curve. In the end, the INL graph 608 quite generically points to the INL worsening on the bottom side of the ADC transfer function; but it is way too coarse to pinpoint specific features of the ADC non-idealities, which are practically blurred into less points with a major loss of resolution. The local INL deviations shown by the arrows in FIG. 5 are spread out in FIG. 6, and the absolute values of the INL error appear lower in INL graph 608 as compared to the disclosed method resulting in the INL profile 502. Consequently, the critical identification of the cubic bowing is almost completely impeded.

The case outlined in these figures demonstrates how, even a very sparse 18-point INL extraction according to the method described herein, significantly enhances the intelligibility over the traditional histogram method (by 3×, in a 3-bit resolution situation), while offering the additional advantage of the absence of numerical issues in the process. In fact, unlike the histogram method, the disclosed method does not rely on probability density functions that can exhibit singularities even in the relatively simple case of a simple sinusoid.

The method described herein samples the input signal at high speeds, sometimes at the GigaHertz level, and dynamic distortion effects intervening in the Sample/Hold or Track/Hold front-end blocks are captured. Also, signal source, signal conditioning, and other front-end effects are possible that may produce a distorted sinusoid at the ADC input, and that as such will instead be ascribed to the ADC itself. However, a general non-linearity profile inclusive of all effects is often preferable, for example, when an RF front-end is integrated along with the ADC and needs correction in the same calibration process.

In some implementations, artificial code deviations may be introduced if the noise does not uniformly span the LSB range from code to code. In between two "noisy" codes where the signal straddles a threshold, a dead zone of "perfect quantization" may occur if no threshold is exercised by the DC level plus noise. However, this circumstance is not normally verified, since the root-mean square (RMS) quantization noise level alone is 1 LSB/sqrt(12)=0.288 $LSB_{RMS}$ under the hypothesis of a uniform distribution and large signal. Designing for resolutions 0.5-bit below the theoretical ENOB, which is customary in this field, leads to a doubling of such noise with thermal noise of the same RMS power, which would bring the 6-sigma peak-peak noise of the ADC to span more than 2 levels, at 2.4 LSB. While due to the quantization terms the final shape of the noise will likely not be Gaussian, from the previous considerations in most practical situations a noise level spanning more than one threshold is therefore very likely. When the thermal limitation is below the quantization level, truncated ADCs (e.g. an 8-bit used as a 4-bit) should be treated in a completely different way: but even in such a special case, an appropriate amount of input dither may be added, and the operational mode proposed in this method disclosure can still be reproduced.

A last caveat when adding artificial amounts of noise to implement this method is the potential for artificial linearization imparted on the ADC. It may be shown that the resulting INL in case of external dithering is equivalent to the true ADC INL, convoluted with the probability density function (pdf) of the dither noise fed to the system. In case of a uniform dither spanning exactly 1 LSB, which yields the same quantization noise power and 0.5-bit reduction in ENOB, many sub-LSB features of the INL would be smoothed out as a consequence, which may be undesirable for design investigation purposes.

Figure 7:
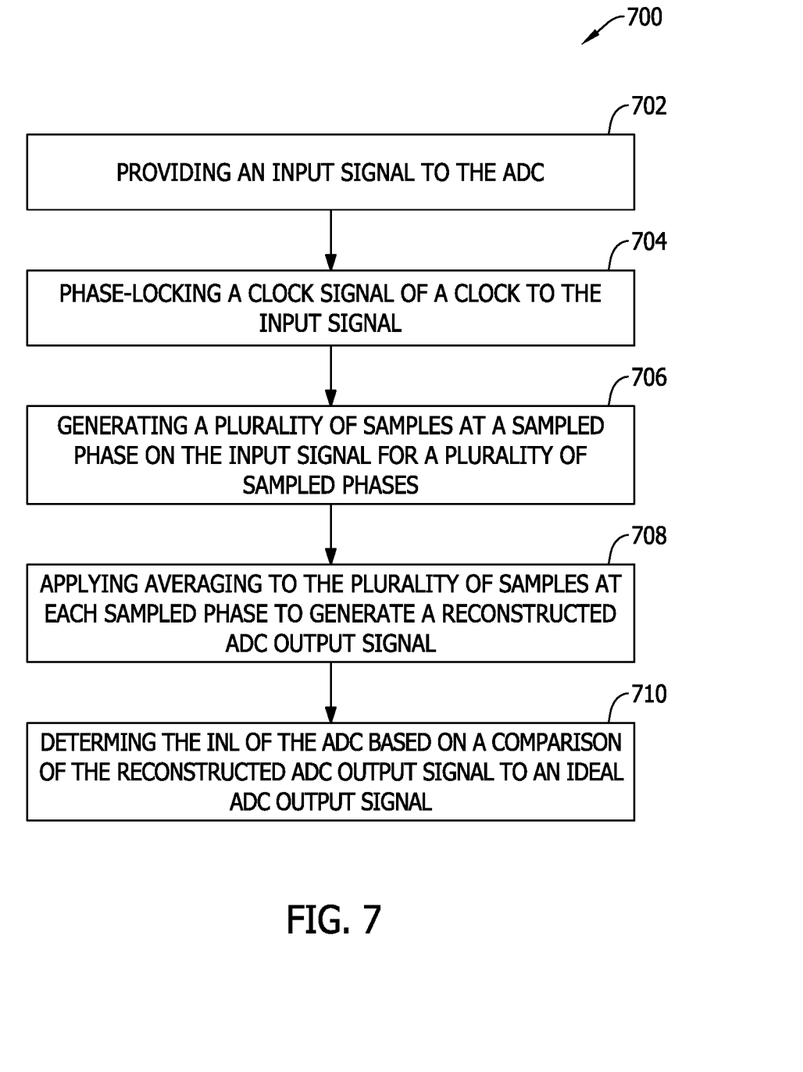
FIG. 7 is a flowchart of an exemplary method of determining INL for an ADC according to the teachings of this invention.

FIG. 7 is a flowchart of an exemplary method 700 of determining INL for an ADC. In the exemplary implementation, the method 700 includes providing 702 an input signal to the ADC. The method 700 also includes phase-locking 704 a clock signal of a clock of the ADC to the input signal. The method 700 includes generating 706 a plurality of samples at a sampled phase on the input signal for a plurality of sampled phases. The method 700 further includes applying 708 averaging to the plurality of samples at each sampled phase to generate a reconstructed ADC output signal. The method 700 further includes determining 710 INL of the ADC based on a comparison of the reconstructed ADC output signal to a theoretical ADC output signal.

In some implementations, the method 700 also includes phase-shifting one of the input signal and the clock signal, relative to the other of the clock signal and the input signal, to phase shift the sampled phase and thus span the plurality of sampled phases.

In some implementations, generating the plurality of sampled phases further includes rotating the input (or equivalently, the clock) signal phase in steps, in order to cover a full-scale of the ADC.

In some implementations, providing the input signal to the ADC comprises providing a sine wave to the ADC. The sine wave may have a fixed frequency and amplitude. In such implementations, the method 700 may also include capturing a plurality of digital samples output by the ADC at a given sampled phase on the input signal.

In some implementations, determining the INL further includes subtracting the theoretical ADC output signal from the ADC reconstructed output signal.

In some implementations, determining the INL further includes comparing averaged input signal discrepancies against a theoretical input signal over an observation span of one signal period.

In some implementations, phase-locking the clock signal to the input signal further includes generating a plurality of digital bit streams corresponding to constant direct current (DC) levels. In such implementations, the applying averaging to each sampled phase record may further include applying a fixed-length averaging to each of the plurality of DC digital bit streams to extract a plurality of DC values that reconstruct an equivalent time-sampled sinusoid period over the phase of the input signal.

In some implementations, phase-locking the clock signal to the input signal further includes configuring the clock to take measurements against the input signal at the same frequency as the input signal.

The determined INL profile may then be used to generate INL compensation parameters for compensating the ADC. INL compensation parameters may include any list, map, table, database, or any other suitable data structure for storing and/or computing a plurality of INL compensation parameters. In some implementations, the INL compensation parameters may include a plurality of entries, wherein each entry may include a particular ADC code and a compensation signal value associated with the particular ADC code for correcting the INL. Thus, the INL compensation parameters may take the form of a look-up table, in which an entry in the table may be addressed by the ADC output code and return a corresponding compensation signal value. In some embodiments, INL compensation parameters may be modified after factory phasing (e.g., after delivery to end user). For example, in some implementations, updated compensation parameters may be communicated (e.g., via wireless connection) in a manner similar to a firmware update. In these and other embodiments, the calibration phase may be repeated periodically to again calculate INL (e.g., to account for aging of an ADC over time).

Figure 8:
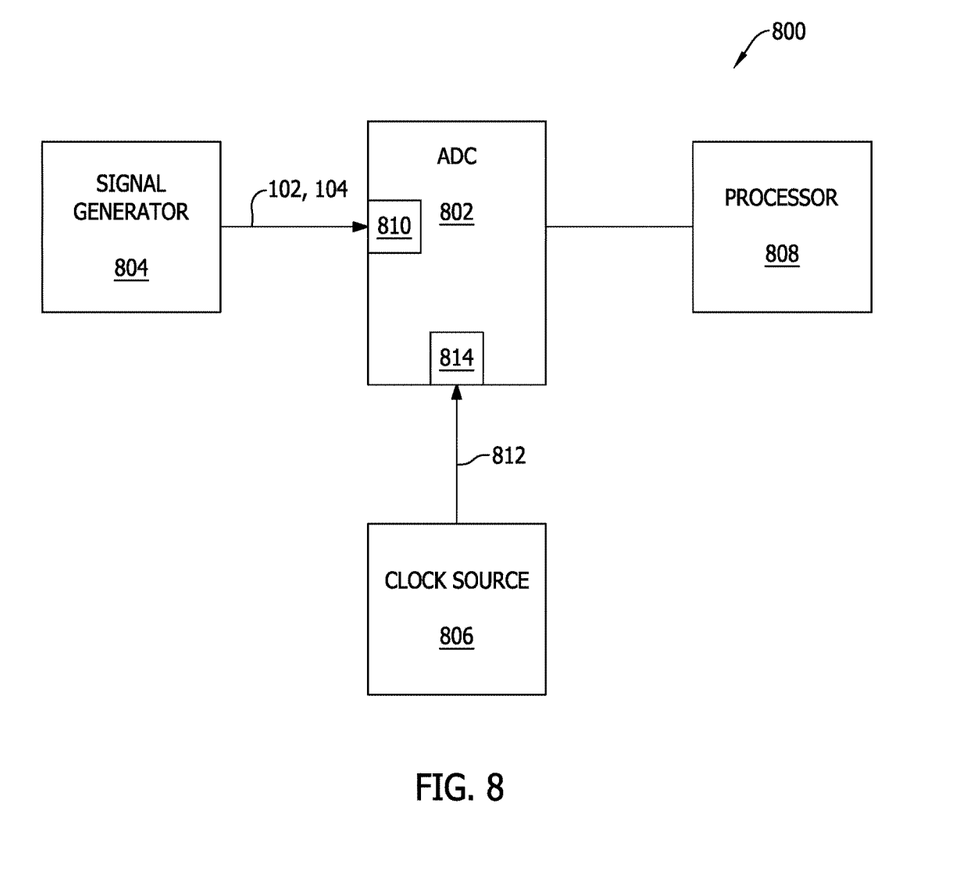
FIG. 8 is a block diagram of a system for determining INL of an ADC.

FIG. 8 is a block diagram of one implementation of a system 800 for determining INL of an ADC 802. The system 800 includes ADC 802, a signal generator 804, a clock source 806, and a processor 808. Although described herein as being separate components relative to ADC 802, the signal generator 804, the clock source 806, and/or the processor 808 may be standard components integrated over the same ASIC (Application-Specific Integrated Circuit) with ADC 802, e.g. to realize a complete Receiver/Transmitter (transceiver) function, as is known in the art. The signal generator 804 may be, for example, a radio frequency (RF) source that generates a sine wave having a fixed frequency and fixed amplitude. The signal generator 804 transmits input signals 102, 104 (shown in FIG. 1) to an input 810 of ADC 802, which are used as the signals to be sampled. The clock source 806 transmits a clock signal 812 to a clock 814 of the ADC 802, which is used to determine which points of the input signal are to be sampled. The clock source 806 is synchronized with the signal generator 804. More specifically, the clock signal 812 generated by the clock source 806 is phase-locked, or aligned, to the input signals 102, 104 from the signal generator 804. The processor 808 is configured to determine INL based on an output of the ADC 802 in accordance with the methods described in FIGS. 1-7.

The INL determination method described herein may be implemented by any system, device, or apparatus configured to utilize an ADC converter such as, but not limited to, GPS, a wireless communication system, and RADAR/LIDAR systems for aerospace and automotive applications using data combining from multiple antennas. Alternatively, the method may be implemented by any system, device, or apparatus that includes a signal generator, a clock, and a digital signal processor.

The above-described implementations of the methods and systems for determining INL described herein effectively improve the precision and intelligibility of INL extraction from ADCs. Also, the methods and systems for determining INL described herein improve speed, resolution, and reliability of ADCs without greatly increased circuit complexity and expense. Moreover, the methods and systems for determining INL described herein are implementable in modern applications demanding sampling frequencies into GigaHertz ranges and preferentially, though technically not limited to, 4-bit or lower resolution, to yield higher resolution and lower distortion performance.

Exemplary technical effects of the above-described implementations of the methods and systems for determining INL includes at least one or more of the following: (a) improving the precision and intelligibility of INL extraction from ADCs; (b) improving efficiency and accuracy of ADC calibrations; (c) improving speed, resolution, and reliability of ADCs without greatly increasing circuit complexity and expense; and (d) providing methods and systems for determining INL that are implementable in modern applications demanding sampling frequencies into GigaHertz ranges and preferentially, though technically not limited to, 4-bit or lower resolution.

Example systems and apparatus of the methods and systems for determining INL are described above in detail. The apparatus illustrated is not limited to the specific implementations described herein, but rather, components of each may be utilized independently and separately from other components described herein. Each system component can also be used in combination with other system components.

Some implementations involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer-readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms memory, processor, and processing device.

Although specific features of various implementations of the disclosure may be shown in some drawings and not in others, this is for convenience only. In accordance with the principles of the disclosure, any feature of a drawing may be referenced and/or claimed in combination with any feature of any other drawing.

The singular forms "a", "an", and "the" include plural references unless the context clearly dictates otherwise. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, and such ranges are identified and include all the sub-ranges contained therein unless context or language indicates otherwise.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method (700) of determining integral non-linearity (INL) of an analog-to-digital converter (ADC) (802), said method comprising:

providing (702) an input signal (102, 104) to the ADC;
phase-locking (704) a clock signal (812) of a clock (806) of the ADC to the input signal;
generating (706) a plurality of samples (202, 204, 206, 208) at a sampled phase on the input signal for a plurality of sampled phases;
applying (708) averaging to the plurality of samples at each sampled phase to generate a reconstructed ADC output signal (302); and
determining (710) the INL of the ADC based on a comparison of the reconstructed ADC output signal to a theoretical ADC output signal (402).

2. The method according to claim 1, further comprising phase-shifting one of the input signal and the clock signal relative to the other of the clock signal and the input signal to phase shift the sampled phase over the plurality of sampled phases.

3. The method according to claim 1, wherein generating the plurality of samples further comprises rotating a phase of the input signal in steps to cover a full-scale of the ADC.

4. The method according to claim 1, wherein providing the input signal to the ADC comprises providing a sine wave to the ADC.

5. The method according to claim 4, wherein providing the sine wave comprises providing a sine wave having a fixed frequency and amplitude.

6. The method according to claim 5, further comprising capturing a plurality of digital samples output by the ADC at a sampled phase on the input signal.

7. The method according to claim 1, wherein determining the INL further comprises subtracting the theoretical ADC output signal from the reconstructed ADC output signal.

8. The method according to claim 1, wherein determining the INL further comprises comparing averaged input signal period discrepancies against a theoretical input signal.

9. The method according to claim 1, wherein phase-locking the clock signal to the input signal further comprises generating a plurality of digital bit streams corresponding to constant direct current (DC) levels.

10. The method according to claim 9, wherein applying averaging to the plurality of samples further comprises applying averaging to each of the plurality of digital bit streams to extract a plurality of DC values that reconstruct an equivalent time-sampled sinusoid period over phase of the input signal.

11. The method according to claim 1, wherein phase-locking the clock signal to the input signal further comprises configuring the clock to take measurements against the input signal at the same frequency as the input signal.

12. A system (800) for determining Integral Non-Linearity (INL) of an Analog-to-Digital Converter (ADC) (802), said system comprising:

a signal generator (804) configured to provide an input signal (102, 104) to the ADC; and
a processor (808) configured to:
phase-lock a clock signal (812) of a clock (806) of the ADC to the input signal;
generate a plurality of samples (202, 204, 206, 208) at a sampled phase on the input signal for a plurality of sampled phases;
apply averaging to each plurality of samples to generate a reconstructed ADC output signal (302); and
determine the INL of the ADC based on a comparison of the reconstructed ADC output signal to a theoretical ADC output signal (402).

13. The system according to claim 12, wherein said processor is further configured to phase-shift one of the input signal and the clock signal relative to the other of the clock signal and the input signal to phase shift the sampled phase over the plurality of sampled phases.

14. The system according to claim 12, wherein to generate the plurality of samples, said processor is further configured to rotate a phase of the input signal in steps to cover a full-scale of the ADC.

15. The system according to claim 12, wherein to provide the input signal to the ADC, said signal generator is further configured to provide a sine wave having a fixed frequency and amplitude to the ADC.

16. The system according to claim 12, wherein to determine the INL, said processor is further configured to subtract the theoretical ADC output signal from the reconstructed ADC output signal.

17. The system according to claim 12, wherein to determine the INL, said processor is further configured to compare averaged input signal period discrepancies against a theoretical input signal.

18. The system according to claim 12, wherein to phase-lock the clock signal to the input signal, said processor is further configured to generate a plurality of digital bit streams corresponding to constant direct current (DC) levels.

19. The system according to claim 18, wherein to apply averaging to the plurality of samples, said processor is further configured to apply averaging to each of the plurality of digital bit streams to extract a plurality of DC values that reconstruct an equivalent time-sampled sinusoid period over phase of the input signal.

20. The system according to claim 12, wherein to phase-lock the clock signal to the input signal, said processor is further configured to cause the clock to take measurements against the input signal at the same frequency as the input signal.

* * * * *